United States Patent
Cathelin et al.

(10) Patent No.: US 8,212,701 B2
(45) Date of Patent: Jul. 3, 2012

(54) INTEGRATED CIRCUIT AND CORRESPONDING METHOD OF PROCESSING A MULTITYPE RADIO FREQUENCY DIGITAL SIGNAL

(75) Inventors: Andreia Cathelin, Laval (FR); Axel Flament, Marcq en Baroeul (FR); Andreas Kaiser, Villeneuve d'Ascq (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 12/988,265

(22) PCT Filed: Apr. 16, 2009

(86) PCT No.: PCT/FR2009/050711
§ 371 (c)(1),
(2), (4) Date: Oct. 15, 2010

(87) PCT Pub. No.: WO2009/138635
PCT Pub. Date: Nov. 19, 2009

(65) Prior Publication Data
US 2011/0102224 A1    May 5, 2011

(30) Foreign Application Priority Data
Apr. 18, 2008   (FR) ..................... 08 52655

(51) Int. Cl.
*H03M 3/00* (2006.01)
(52) U.S. Cl. .................... 341/143; 341/144; 375/295
(58) Field of Classification Search .......... 341/143–144; 375/295
See application file for complete search history.

(56) References Cited

U.S. PATENT DOCUMENTS

| | | | | |
|---|---|---|---|---|
| 6,317,468 B1* | 11/2001 | Meyer | | 375/269 |
| 6,515,605 B2* | 2/2003 | Panasik et al. | | 341/143 |
| 7,061,989 B2* | 6/2006 | Bellaouar et al. | | 375/295 |
| 7,528,754 B1* | 5/2009 | Bakkaloglu et al. | | 341/143 |
| 7,755,524 B2* | 7/2010 | Pozsgay et al. | | 341/143 |

OTHER PUBLICATIONS

Nsiala Nzeza C et al: "*Reconfigurable Digital Delta-Sigma Modulator Synthesis for Digital Wireless Transmitters*" Circuit Theory and Design, 2007. ECCTD 2007. 18th European Conference on, IEEE, Piscataway, NJ, USA, Aug. 27, 2007, pp. 480-483, XP031257788 ISBN: 978-1-4244-1341-6.

Frappe A.: "*All-Digital RF Signal Generation Using Delta-Sigma Modulation for Mobile Communication Terminals*" [Online] Dec. 7, 2007, Universite des Sciences et Technologies del Lille, Lille, XP002508612 Retrieved from the internet: URL:http://tel.archives-ouvertes.fr/docs/00/28/09/68/PDF/AFR_These_final.pdf> [Retrieved on Dec. 16, 2008].

Frappe A et al: "*Design Techniques for Very High Speed Digital Delta-Sigma Modulators Aimed at All-Digital RE Transmitters*" Electronics, Circuits and Systems, 2006. ICECS '06. 13th IEEE International Conference on, IEEE, PI, Dec. 1, 2006, pp. 1113-1116, XP031111689 ISBN: 978-1-4244-0394-3.

* cited by examiner

*Primary Examiner* — Khai M Nguyen
(74) *Attorney, Agent, or Firm* — Allen, Dyer, Doppelt, Milbrath & Gilchrist, P.A.

(57) ABSTRACT

An integrated circuit includes input circuitry for receiving a radio frequency digital signal, output circuitry capable of delivering a radio frequency analog signal, and a processing stage coupled between the input circuitry and the output circuitry and including several processing channels in parallel. Each processing channel may include a voltage switching block the input of which is coupled to the input circuitry and a transmission line substantially of the quarter-wave type at the frequency of the radio frequency analog signal coupled in series between the output of the voltage switching block and the output circuitry.

28 Claims, 8 Drawing Sheets

INTEGRATED CIRCUIT AND CORRESPONDING METHOD OF PROCESSING A MULTITYPE RADIO FREQUENCY DIGITAL SIGNAL

FIELD OF THE INVENTION

The invention relates to the processing of digital signals, particularly radio frequency signals, and in particular the digital-analog conversion of such signals and their power amplification. The invention applies advantageously but not limitingly to the field of wireless communication, in particular mobile telephony.

BACKGROUND OF THE INVENTION

Current CMOS technologies use increasingly low supply voltages. Furthermore, for certain applications it is helpful to carry out a digital-analog conversion of a digital signal and, ultimately, to obtain a high-power analog signal.

It would therefore be useful to be able to generate an analog signal of relatively high power from a digital signal processed by a technology, for example CMOS, the supply voltage of which is low, for example one volt. This is the case notably for mobile telephony where the transmission power of the signal may satisfy specified values depending on the standard used.

Furthermore, mobile telephony on its own has many second-generation standards such as GSM and DCS 1800 in Europe, and IS-95 in the United States. There are also three third-generation standards, namely the European UMTS, the American CDMA 2000 and the Chinese TD-SCDMA. Furthermore, there are two intermediate standards between that of the second generation and that of the third generation, namely GPRS and the Edge standard. More and more mobile terminals also incorporate Bluetooth technology (IEEE 802.15.1) allowing short-range communications and Wi-Fi technology (IEEE 802.11) making it possible to access wireless local access networks (WLAN).

The production of a terminal, such as a mobile telephone, compatible with these various standards nowadays involves the production of several different radio frequency chips. It is therefore currently envisaged to use circuits capable of adapting to several transmission standards while keeping the same hardware infrastructure.

In an attempt to achieve this objective, approaches involve increasing the volume of the digital portion of the transmission chain relative to that of the analog portion which is more difficult to reconfigure.

Therefore, a first approach that has been envisaged includes processing the "baseband" and "intermediate frequency" portion of the transmission chain in a digital manner. This approach moves in the direction of a certain flexibility of the system.

Furthermore, the advances in submicron CMOS technologies now make it possible to achieve high working frequencies. Also, prior theoretical approaches have envisaged a greater digitization of the transmission chain, notably incorporating frequency transposition digital processes to reach the radio frequency domain.

There is therefore currently a desire, in the context of development of "Software Defined Radio" (SDR), that is to say radio that can be reconfigured, to retain flexibility at the digital/analog interface and at the power amplifier.

SUMMARY OF THE INVENTION

According to one embodiment and application, a device and a method are proposed which make it possible to provide necessary power while using low supply voltages. According to one application and embodiment, there is also an electronic device and a radio frequency digital signal processing method allowing flexibility in the generated power so as to be able to adapt to various transmission standards.

Also proposed, according to one application and embodiment, is an electronic device and a processing method incorporating digital filtering which may optionally be reconfigurable so as to be able to adapt to various transmission standards.

According to one aspect, there is an integrated circuit, incorporating an electronic device comprising input means or circuitry for receiving a radio frequency digital signal, output means or circuitry capable of delivering a radio frequency analog signal, and a processing stage coupled between the input means or circuitry and the output means or circuitry. This processing stage comprises several (at least two) processing channels in parallel. Each processing channel includes a voltage switching block the input of which is coupled to the input means or circuitry, and a transmission line substantially of the quarter-wave type at the frequency of the radio frequency analog signal, coupled in series between the output of the voltage switching block and the output means or circuitry.

The electronic device according to this aspect is noteworthy in that it fulfils the dual function of digital/analog conversion and of power amplification. Specifically, the voltage switching blocks notably provide the digital/analog conversion, and the analog summation of the signals delivered by the voltage switching blocks, through the transmission lines, allows a recombination of power and consequently an increase in the power gain. In particular, a special configuration of the voltage switching blocks and of the impedance characteristic of the transmission line makes it possible to obtain a power gain proportional to the square of the number of processing channels used. It is therefore possible to obtain a relatively high power with a relatively low supply voltage of the voltage switching portion.

Furthermore, in the case of a voltage switching block, the signal to be processed is usually a signal of the square type in which it is possible to recover a portion of the spectral information, which involves the use of a filter comprising, for example, a series LC assembly, which has an impedance which is theoretically zero at the tuning frequency and ideally infinite outside its bandwidth. Accordingly, the power provided by the power supply contains the useful information. The use of such voltage switching blocks is therefore preferable to the use of current switching blocks for which the selective filter is usually configured in a parallel LC assembly which has an impedance that is theoretically infinite at the tuning frequency and ideally zero outside its bandwidth, which results in the power provided by the power supply containing not only the useful power but also the outband power.

Furthermore, in addition to the fact that a recombination of power from transmission lines makes it possible to generate the power necessary for the transmission of the signal from low supply voltages, the transmission lines are frequency-selecting elements thereby making it possible to perform a first filtering function at the output of the voltage switching blocks which allows, in particular, a first filtering of quantization noise of the radio frequency signals, which is particularly valuable in the case of a radio frequency signal originating from a modulator of the delta-sigma type.

Furthermore, a high quality-factor technology makes it possible to effectively integrate the transmission lines while considerably reducing the losses of these elements. The transmission lines may advantageously be individually selectable. The delivered power is then variable according to the number of processing channels actually selected. This is particularly valuable in multi-standard applications where the specified transmission powers may be different.

In particular, when the integrated circuit is incorporated into a transmission chain of a wireless terminal, it is helpful to filter the signal before transmitting it in order to satisfy the specifications imposed by the use of the corresponding communication standard. This is particularly true when a delta-sigma modulation is used upstream of the digital/analog conversion, which formats the quantization noise in order to push it outside the useful band, which has the consequence of drastically increasing the filtering constraints in systems employing this technique.

In these circumstances, according to one embodiment, the processing stage also comprises a filtering stage which is partially coupled between the input means or circuitry and the voltage switching blocks, and partially formed by at least certain of the processing channels. In other words, the architecture of the integrated circuit using processing channels makes it possible to use these processing channels in the production of the filtering stage, which makes it possible to combine at least partially the filtering function with the dual function of digital/analog conversion and of power amplification, while reducing the surface area of the integrated circuit.

Specifically, the fact that the processing channels are connected in parallel and consequently carry out a summation of the analog signals makes it possible to perform this advantageous summation function in the context of the production of a filtering stage.

Furthermore, in a particular embodiment, the number and the values of the coefficients of the filter depend on the number of processing channels actually selected. The portion of the filtering stage that is coupled between the input means or circuitry and the voltage switching blocks comprises for example digital delay means or circuitry, which in particular makes it possible to determine and adjust the order of the filter produced by the filtering stage.

When the filtering stage comprises digital delay means or circuitry, the filter is then semi-digital because of the analog summation carried out in the transmission lines. This being so, the term "digital" filter will nevertheless be used in this case in misuse of the term by reason notably of the inclusion of a clock signal in the definition of the delays.

However the portion of the filtering stage situated upstream of the voltage switching blocks could also be analog (delays achieved for example by analog components such as transmission lines). Specifically, when the signal upstream of the voltage switching blocks is a digital signal the logic levels of which are materialized by different discrete levels of voltage, it is naturally possible to carry out an analog filtering process on these voltage levels.

The digital filtering stage is advantageously a digital filtering stage of the finite impulse response (FIR) type. The use of a filter of the FIR type is advantageous because such a filter is unconditionally stable and its phase response may be perfectly linear if necessary, which is the case if the coefficients of the filter are chosen to be symmetrical.

In order to be able to filter the signal with a filter compatible with specifications of several transmission standards, it is particularly advantageous that the filtering stage, for example digital filtering stage, may be reconfigured, in particular that it may be reconfigured on command amongst a predetermined set of different filters characterized by different coefficients and/or orders.

In this respect, one approach may include providing a controllable multiplexing stage coupled between the digital delay means or circuitry of the filtering stage and the voltage switching blocks. Another approach, which furthermore may not be compatible with the above, may include providing digital delay means or circuitry having adjustable delay values.

One approach for producing a voltage switching block provides for the use of a CMOS inverter. This being so, depending on the envisaged application, and in particular depending on the impedance of the transmission antenna of a transmission chain, and depending on the value of the supply voltage used, it may be preferable to use, in each voltage switching block, a chain of inverters of increasing sizes. Furthermore, it is advantageous that the electronic device has a differential architecture. Specifically, such a differential structure makes it possible in particular to make the pulse edges symmetrical and therefore to dispense with the problem of interference between symbols.

According to one embodiment, the integrated circuit also comprises a delta-sigma modulator coupled to a digital mixer capable of delivering the radio frequency digital signal. Specifically, a delta-sigma modulator is particularly advantageous in the case of wireless communication applications where the band specifications are drastic, because the delta-sigma modulator makes it possible to quantize a signal oversampled on n bit, into a signal on N bit, for example 1 bit, N being usually less than n. According to another aspect, a further proposal is a chain for transmitting a radio frequency signal comprising an integrated circuit as defined above, coupled to a transmission antenna. According to another aspect, a further proposal is an element of a wireless communication system, for example a cellular mobile telephone, incorporating such a transmission chain.

According to another aspect, a further proposal is a method of processing an initial radio frequency digital signal, comprising performing a digital/analog conversion with power amplification comprising several voltage switching processes carried out in parallel on an intermediate radio frequency digital signal originating from the initial signal, and delivering respectively elementary analog signals. A summation of the elementary analog signals may then be performed through several transmission lines, these transmission lines being able to be selected individually, so as to deliver a radio frequency analog signal the power of which is greater than that of the initial digital signal, the transmission lines being substantially of the quarter-wave type at the frequency of the radio frequency analog signal.

According to one application, the method also comprises a filtering, in particular a digital filtering, of the initial signal delivering the intermediate signal, this filtering using partially the processing channels actually selected. According to one application, the order of the filtering is adjusted by delaying in an adjustable manner certain samples of the initial signal upstream of the voltage switching processes. The filtering can also be reconfigured.

According to another aspect, a method of transmitting a radio frequency analog signal is also proposed comprising a digital modulation process of the delta-sigma type carried out on a baseband digital signal, a digital frequency transposition carried out on the modulated digital signal and a processing method as defined above, carried out on the initial radio frequency digital signal originating from the frequency transposition.

BRIEF DESCRIPTION OF THE DRAWINGS

Other advantages and features of the invention will appear on examination of the detailed description of applications and embodiments, that are in no way limiting, and of the appended drawings in which.

DETAILED DESCRIPTION OF THE PREFERRED EMBODIMENTS

Although the invention is not limited to this application, exemplary applications and embodiments that are more particularly applicable in the field of mobile telephony will now be described in greater detail.

Figure 1:
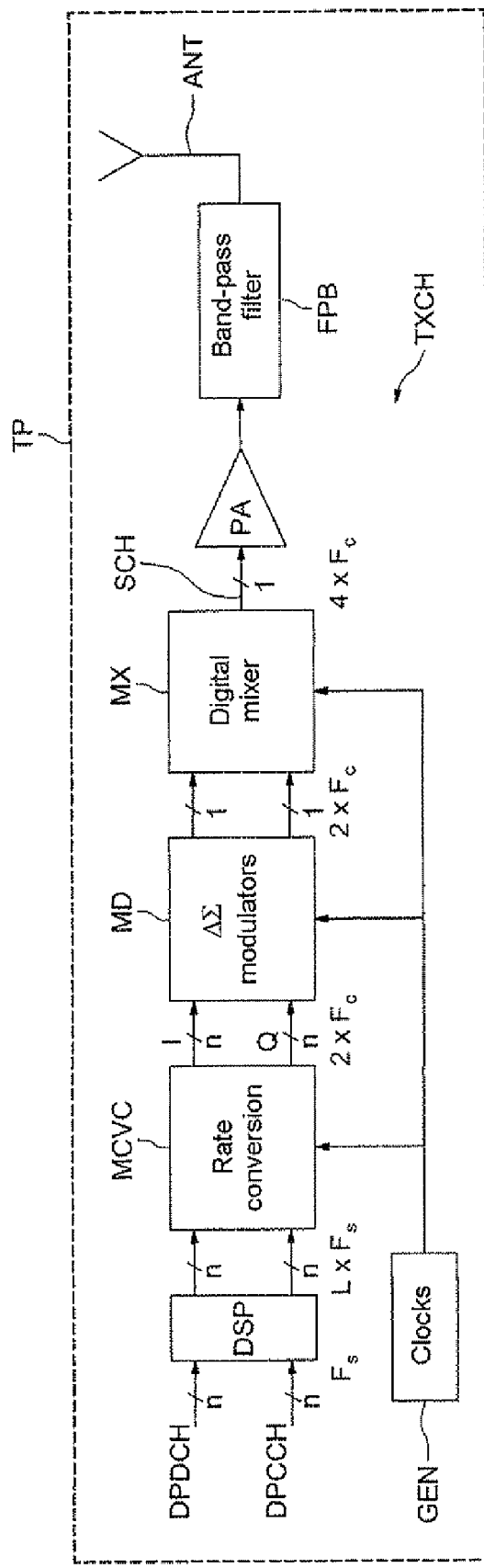
FIG. 1 illustrates schematically an embodiment of a transmission chain of a cellular mobile telephone, according to the invention.

In FIG. 1, the reference TP denotes an element of a wireless communication system, for example a terminal such as a mobile telephone and the reference TXCH designates the transmission chain incorporated into this mobile telephone. This transmission chain TXCH comprises a signal processing processor DSP receiving information contained in the DPDCH (Dedicated Physical Data Channels) and DPDCH (Dedicated Physical Control Channels) input signals and capable of carrying out the operations of channel encoding. In the example of applications described here, Fs denotes the bit rate of the symbols or fragments ("chips" as is well known to those skilled in the art) and Fc is the central frequency of the transmission band of the transmission standard considered.

Within the DSP processor, the signals are spread out over a band of approximately 5 MHz, which is the width of a UMTS channel, and are sampled at twice the fragment bit rate, namely 7.68 MHz (3.84×2). Furthermore, the transmission chain may be able to place this 5 MHz signal on one of the twelve possible channels, since the transmission and reception bandwidth in the context of the UMTS standard is 60 MHz. This is done in conventional fashion thanks to half-band filters and a CORDIC (Coordinate Rotation Digital Computing) algorithm. These half-band filters oversample the signal by 16 in order to obtain a sampling frequency of 122.88 MHz, that is to say 32 times the Fs frequency. This makes it possible to reject the image outside the useful band which spreads from −30 MHz to +30 MHz.

The transmission chain TXCH furthermore comprises a modulation stage of the delta-sigma type, referenced MD. In the architecture in question, the input of the modulation stage MD may be sampled at twice the central frequency of the UMTS standard, or 3.9 giga symbols/second (twice 1.95 GHz). However, since the DSP processor which carries out the baseband processing delivers signals sampled at 122.88 MHz, it is helpful to carry out a rate conversion in order to switch from one sampling to another. This is the role of the rate conversion means or circuitry MCVC.

The delta-sigma modulation stage MD makes it possible to quantize the oversampled signal on n bit present at its input into a signal on N bit, N being less than n. In the present case, N is equal to 1. This operation is carried out without degrading the signal in the useful band while transmitting the quantization noise out of this same band, which is very noticeable in the case of mobile communication where the in-band specifications are drastic.

Any delta-sigma modulator architecture may be used, in particular that with non-exact quantization described in French patent application No. 0752701 the content of which is hereby incorporated by reference into the present description in its entirety.

The radio frequency signal delivered by the delta-sigma modulator is a baseband signal (frequency spectrum of the signal centered substantially on the zero frequency) on a bit rated at a sampling frequency equal to twice Fc, or 3.9 giga symbols/second for the UMTS or else 3.495 giga symbols/second for the DCS standard. The quantization noise generated by the transition of the signal from n bit to 1 is formatted outside the useful band.

The digital signal delivered by the delta-sigma modulation stage is a baseband signal which should be transposed in the radio frequency field. This is the role of the digital mixer MX. As an indication, in order to carry out the radio frequency digital transposition of two input digital signals, a method involves generating a digital sine and a digital cosine at the Fc frequency. In view of this, according to the Shannon theorem, a sampling at 4Fc of the sine and of the cosine is sufficient to correctly retranscribe these signals. This then gives a string [1; 0; −1; 0] for the cosine and [0; 1; 0; −1] for the sine, each bit having a duration of ¼Fc.

The sequences I (phase channel) and Q (phase quadrature channel), which are usually multibit symbol sequences, are then weighted by these patterns and then added. Therefore, in each clock period, one of the arguments is zero, the other taking the value of the I or Q signal multiplied by +1 or −1. This operation may be easily carried out with "exclusive OR" logic gates or transmission gates.

The signal originating from the digital mixer MX is, in this instance, a digital signal on one bit sampled at the 4Fc frequency. In addition to the elements that have just been described, a clock signal generator GEN provides the various clock signals to the various means of the digital processing chain.

The radio frequency signal coded on 1 bit, originating from the digital mixer MX, occupies a frequency band close to the central frequency of the envisaged communication band, and is sampled at four times this central frequency Fc.

In the case of the UMTS standard, the central frequency of the communication band (containing the various communication channels) is equal to 1.95 GHz. It is equal to 1.7475 GHz for the DCS standard. The high-rate radio frequency signal SCH, generated at this level of the transmission chain, will now undergo an operation of conversion from the digital domain to the analog domain, combined with a power amplification in order to be able to be transmitted via the antenna ANT after entering a band-pass filter FPB.

Figure 2:
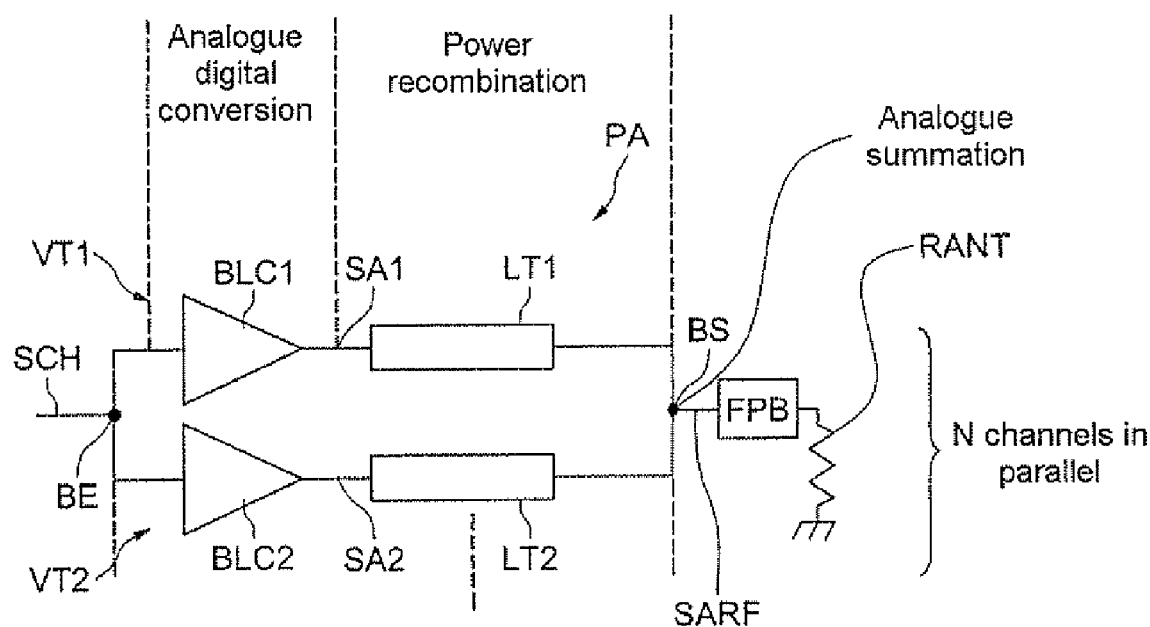
FIG. 2 illustrates in greater detail but still schematically an exemplary embodiment of an electronic device, according to the invention.

This combined operation of digital/analog conversion and of power amplification is carried out in a device PA, exemplary structures of which will now be described in greater detail with reference to FIG. 2 and following. These examples of structures are described for an SCH signal on 1 bit. Naturally those skilled in the art will be able to adapt these examples for signals sampled on a number of bits greater than one. In FIG. 2, it can be seen that the device PA comprises N parallel processing channels VT1, VT2, etc. N is greater than or equal to 2.

Each processing channel, VT1, for example, combines a voltage switching block BLC1 the input of which is coupled to the input BE of the device PA, and the output of which is coupled to a transmission line LT1 the output of which is coupled to the output terminal BS of the device PA. This output terminal is furthermore coupled to the antenna ANT the impedance RANT of which is shown in FIG. 2.

Each voltage switching block carries out a digital/analog conversion of the digital signal received at its input and delivers a corresponding elementary analog signal, SA1 for example. Since the processing channels are connected in parallel, the transmission lines $LT_i$ carry out an analog summation of these elementary analog signals with an increase in power. And, in a particular case of configuration of the voltage switching blocks and of the characteristic impedance of the transmission line, the gain in power of the analog signal SARF delivered to the output BS of the device PA is equal to $N^2$ where N designates the processing channels actually used. More precisely, this maximum gain equal to $N^2$ is achieved when the characteristic impedance Z0 of the transmission line tends towards infinity or when the output impedance of the voltage switching blocks is negligible before $Z0^2/NRL$, where RL designates the impedance of the load (for example the antenna) connected to the transmission lines. Those skilled in the art will be able to adjust the value of Z0 taking account of the compromise that is sought between output and power increase.

In addition to its characteristic impedance, each transmission line has a length, expressed as a fraction of a wavelength. In the envisaged application, the length of the transmission line is equal to $\lambda/4$ at the frequency Fc, where $\lambda$ designates the wavelength. This transmission line is therefore a transmission line of the quarter-wave type.

Such a transmission line is understood by those skilled in the art. It may be produced by passive components according to a technique called the localized elements technique or else based simply on a metal line according to another technique called the distributed elements technique.

When the transmission line is produced based on a metal line, its length is chosen, for example, according to the central frequency of the transmission band in line with the envisaged transmission standard. Naturally a tolerance is possible with respect to this length. In addition, even if the wavelength is defined relative to the central frequency (1.95 GHz for the UMTS) of the transmission band (bandwidth equal to 60 MHz for the UMTS), the transmission line may not be strictly quarter-wave if the signal to be transmitted is situated in a channel situated at the end of this transmission band. However, this is not an issue because such a transmission line has a relatively large bandwidth, for example of the order of 15%.

This characteristic of the bandwidth of a transmission line is equally valuable in another respect. Specifically, a transmission line chosen for a first given transmission standard will also be suitable for a second transmission standard the central frequency of which is for example ±15% of that of the first standard. This is the case, for example, for the UMTS and DCS standards in transmission.

Because of the foregoing, it may be said that the transmission line is substantially of the quarter-wave type at the frequency of the analog signal to be transmitted. This being so, it is also possible to provide various sets of transmission lines substantially of the quarter-wave type at various frequencies, these sets being selectable.

Figure 3:
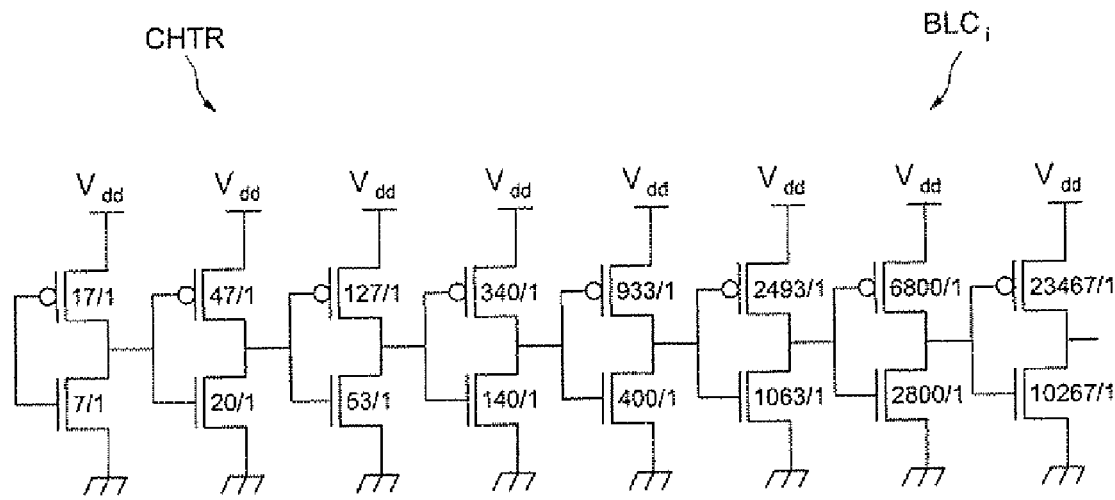
FIG. 3 illustrates in greater detail and still schematically an exemplary embodiment of a voltage switching block, according to the invention.

If the transmission lines are produced based on inductive and capacitive components, it is possible to provide, for example, switched capacitors making it possible to satisfy the substantially quarter-wave type of the transmission line for various frequencies. A particularly simple way of producing a voltage switching block BLCi is to use a CMOS inverter as illustrated schematically in FIG. 3.

This CMOS inverter comprises a PMOS transistor referenced TRPi the source of which is connected to the supply voltage Vdd and an NMOS transistor referenced TRNi, the source of which is connected to earth. The drains of these two transistors are connected to the transmission line LTi.

The gates of the two transistors of the CMOS inverter are controlled by the signal SCH which, in the example described here, is a squarewave signal whose high levels are representative, for example, of a logic "1" and whose low levels are representative of a logic "0". Furthermore, the width W of the channel of each transistor is preferably much greater than the length L of this channel, so as to minimize the resistance of the triode zone of the transistor.

Figure 4:
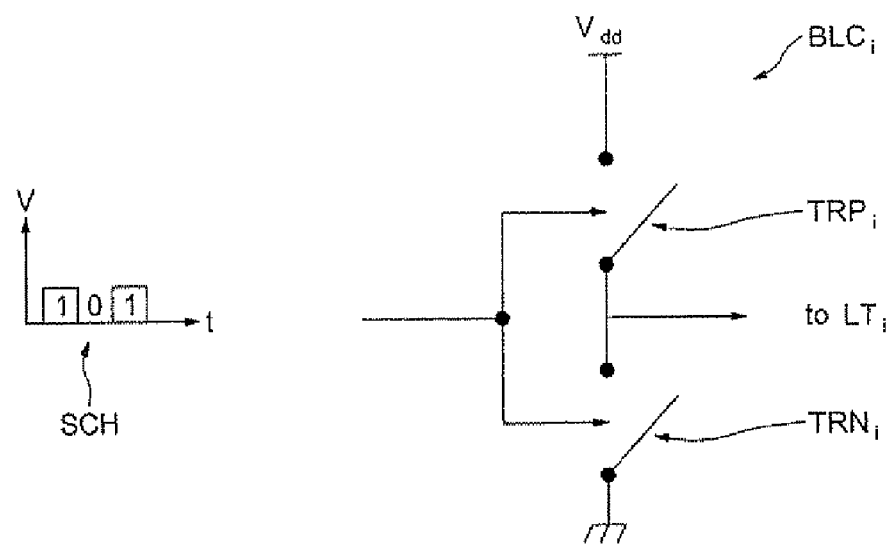
FIG. 4 illustrates another embodiment of a voltage switching block, according to the invention.

In certain applications in which the supply voltage Vdd is particularly low, for example of the order of 1 volt, it may be helpful, as illustrated in FIG. 4, to use, to produce the switching block BLCi, a chain CHTR of CMOS inverters of increasing sizes. This will make it possible in particular to easily control a load of 50 ohms representative of the typical impedance RANT of an antenna, under 1 volt. In FIG. 4, as a non-limiting example, the ratio W/L is indicated for each of the transistors of each of the CMOS inverters.

In operation, the reference voltage Vdd is divided into various levels by means of a resistive network comprising in particular the antenna impedance RANT and the resistance of the transmission line. In the present case, each transmission line forms a filter LC which has a theoretically zero impedance at the tuning frequency and ideally an infinite impedance outside its bandwidth. Therefore, the power provided by the supply contains only the useful information, which is not the case for example in current switching.

The structure illustrated in FIG. 2 makes it possible, as has been explained above, to obtain a radio frequency analog signal having sufficient power, and to do so even under a low supply voltage, thanks to the recombination of power obtained by the analog summation through the transmission lines connected in parallel. This being so, for the purpose of providing flexibility in terms of desired power, it is particularly advantageous that the transmission lines are individually selectable. It is therefore possible to regulate, depending on the number of transmission channels that will be actually selected, the desired output power.

As an indication, a particularly simple way of isolating a transmission channel, that is to say of not selecting it, includes making the transistor TRNi of the CMOS inverter (FIG. 3) constantly on-state. It is particularly valuable, in certain applications, in particular in a mobile telephony application, that the device PA also comprises a digital filtering stage. Specifically, the signal originating from the delta-sigma modulation stage contains a lot of noise outside the useful band of the signal. Also, the digital filtering stage alleviates the constraints on the antenna band-pass analog filtering. In addition, the proximity of prohibited bands forces the designer to limit the out-band transmissions to a great extent. For example, the receive band of the DOS 1800 standard spreads from 1805 to 1880 MHz and that of transmission in the case of the UMTS standard, from 1920 to 1980 MHz, that is a difference of 40 MHz between the two band extremes. Furthermore, the use of simultaneous transmission frequency multiplexing in the case of the UMTS standard prohibits interference transmissions in the corresponding receive band (situated at 130 MHz above the transmit band). The use of a digital filter will therefore make it possible to attenuate certain frequency bands of the transmitted signal so as not to interfere with other frequency bands with respect, for example, to the reception of the signal, or to other transmission standards.

Figure 5:
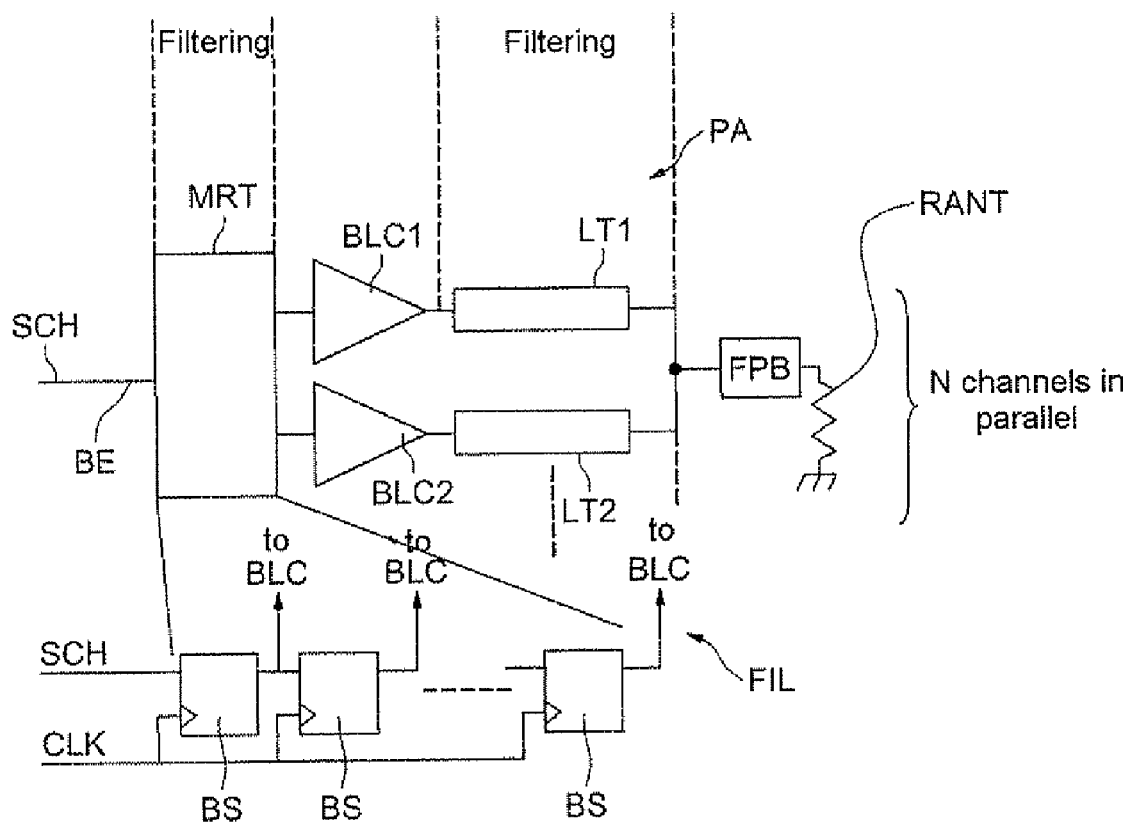
FIG. 5 illustrates another embodiment of an electronic device incorporating a digital filter, according to the invention.

The user should preferably use a filtering of the FIR (Finite Impulse Response) type which is an unconditionally stable filter. The architecture of the device PA based on parallel transmission lines allows the simple hardware production of such a filter which, as will be seen in the rest of the description, is a semi-digital filter or a "digital" filter to use the term incorrectly. Specifically, as illustrated schematically in FIG. 5, such an FIL filtering stage may be produced by placing digital delay means or circuitry MRT between the input means BE and the input of the voltage switching blocks. These digital delay means or circuitry may, as illustrated in FIG. 5, be a delay line formed of a chain of flip-flops BS, rated by the clock signal CLK the frequency of which is equal to 4 times Fc in the example described. Furthermore, the radio frequency digital signal SCH is delivered to the input of the chain of flip-flops.

The number of flip-flops is totally independent of the number of transmission lines. The depth of the delay line contributes to the determination of the order of the filter. Furthermore, the number of processing channels actually selected or used determines the number of coefficients of the filter.

In other words, the choice of the coefficients is limited by the number of channels used. Therefore, in the architecture example described, the coefficients can be whole number coefficients. For example, to produce the coefficient "2", two channels are summed. It is possible to obtain negative coefficients with the use of a differential architecture.

Furthermore, the sum of the absolute values of the coefficients is less than or equal to the number of channels. This being so, it is possible to increase the order of the filter by inserting zeros, "0", in its impulse response. Therefore, even with a limited number of coefficients, it is possible to obtain filters having a narrow transition band and consequently satisfying specifications of a filter of a higher order.

It is particularly valuable, in the context, for example, of a multi-standard mobile telephony application, that the FIL digital filter can be reconfigured, so as to be able to satisfy the specifications of several different transmission standards. One approach for reconfiguring the FIL digital filter may include producing hardware-wise a filtering stage so that in response to a selection signal a particular hardware configuration is selected between the delay means and the processing channels, from several "prewired" hardware configurations representative of digital filters with different characteristics.

Figure 6:
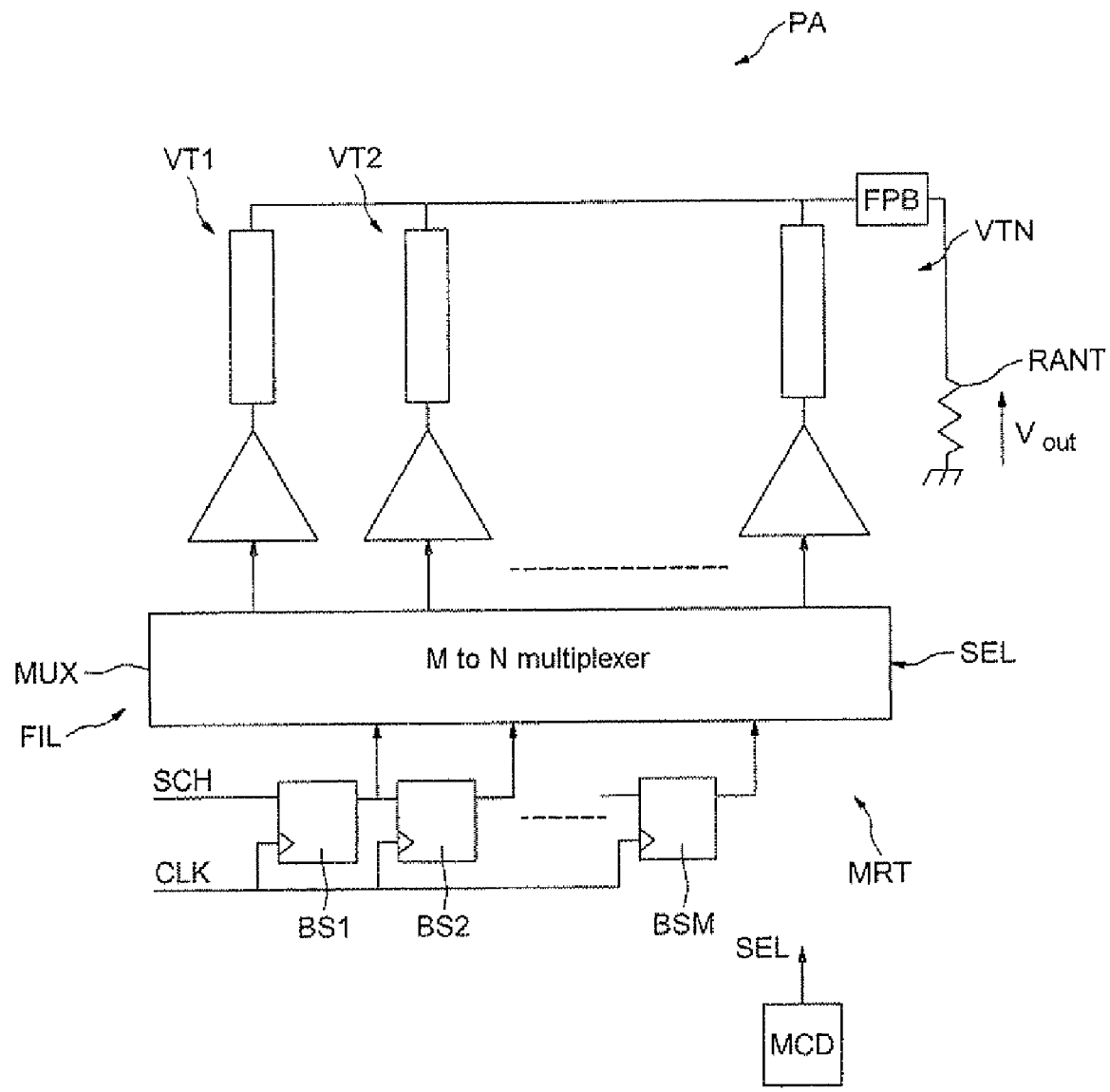
FIG. 6 illustrates schematically another embodiment of an electronic illustrating another possible implementation of a digital filter device, according to the invention.

In this respect, one approach for producing a reconfigurable filter may make provision, as illustrated in FIG. 6, for connecting a multiplexing stage MUX between the various processing channels and the digital delay means or circuitry, in this instance the various flip-flops BS1-BSM of the chain of flip-flops.

In the example illustrated in FIG. 6, the multiplexing stage is a multiplexing stage from M to N since the number of flip-flops of the digital delay means is equal to M and the number of processing channels is equal to N. Therefore, according to the SEL command of the multiplexer MUX, at least certain of the flip-flops will be connected to at least certain of the processing channels, producing a particular filtering configuration. The SEL command signal is generated by command means or circuitry MCD, produced for example in a software manner within the processor of the processing chain.

Another approach for reconfiguring a digital filter may include modifying the frequency of the clock signal CLK.

Another approach may provide for the use of a delay locked loop (DLL) of a structure that is conventional and known by those skilled in the art, and from which clock signals of different frequencies can be generated, designed to rate at least certain of the flip-flops of the delay means or circuitry. Such an approach has the advantage of being able to produce delays that are not necessarily multiples of the period of the clock signal CLK.

Figure 7:
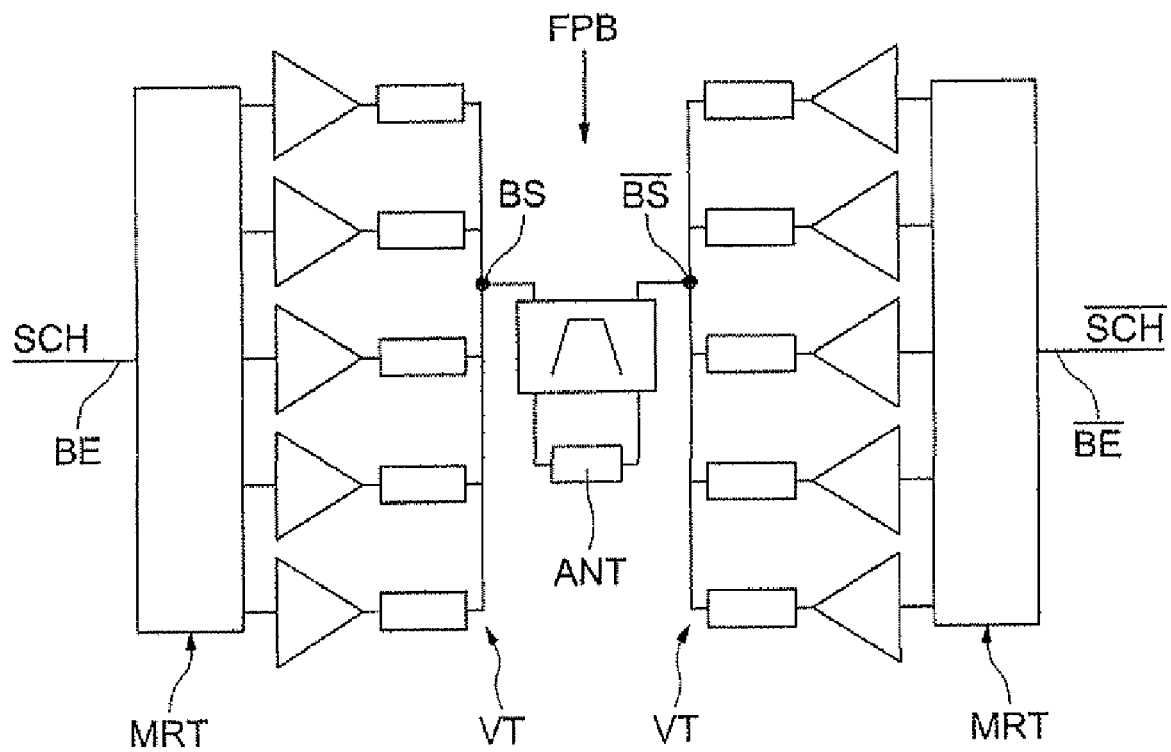
FIG. 7 illustrates schematically a differential architecture of an exemplary electronic device according to the invention.

It should also be noted that all these approaches may also be combined. Although all the embodiments evoked above have been presented in the context of a single-ended architecture, it goes without saying that they may also apply to a differential architecture such as that illustrated schematically in FIG. 7.

With such a differential architecture, the device PA has two inputs BE and $\overline{BE}$, respectively receiving the signals SCH and $\overline{SCH}$. It also comprises a differential output consisting of the terminals BS and $\overline{BS}$ which are connected to the antenna ANT via the band-pass filter FPB.

Such a differential architecture makes it possible in particular to produce negative coefficients for the digital filter by taking samples on the channel $\overline{SCH}$. Based on an exemplary architecture such as that illustrated in FIG. 7, comprising five processing channels VT, a chain of 56 flip-flops BS and a multiplexing stage, it is possible to reconfigure the digital filter between three different configurations.

Since the five processing channels are used, to take advantage of the maximum possible power gain, there are consequently five coefficients b0, b1, b2, b3 and b4 for each of the filters. If the user restricts himself to the FIR digital filters having symmetrical coefficients and delays, the impulse response of such a digital filter is then given by the following formula:

$$H(\omega)=b_0+b_1 z^{-\alpha}+b_2 z^{-(\alpha+\beta)}+b_1 z^{-(\alpha+2\beta)}+b_0 z^{-(2\alpha+2\beta)} \qquad (I)$$

To take advantage of the maximum possible power gain, the five processing channels are used, which results, for the coefficient values, in the following formula:

$$2|b_0|2|b_1|=|b_2|=5 \qquad (II)$$

Amongst the various possibilities for all of these coefficients, three sets have been selected in order to implement three possible FIR filters. The values of the various delays $\alpha$ and $\beta$ and the value of the coefficients and the position of the transmission zeros are given in the table below:

| Delays $\alpha$ and $\beta$ (multiples of $T_e$) | $(b_0, b_1, b_2)$ | Interval of frequency response | Transfer function | Position of the zeros |
|---|---|---|---|---|
| $\alpha = 8$ and $\beta = 8$ | (1, 1, 1) | $F_e/8$ | $H_1(z)$ | $F_e/20$, $F_e/40$ |
| $\alpha = 16$ and $\beta = 8$ | (1, 1, 1) | $F_e/8$ | $H_2(z)$ | $F_e/20$, $F_e/40$, $F_e/48$ |
| $\alpha = 14$ and $\beta = 14$ | (1, −1, 1) | $F_e/14$ | $H_3(z)$ | $F_e/140$, $3F_e/140$ |

The transfer functions of these three filters are therefore written for each of the sets of coefficients, with a sampling frequency Fe equal to 7.8 GHz, by the following formulae:

$$H_1(z)=1+z^{-8}+z^{-16}+z^{-24}+z^{-32}$$

$$H_2(z)=1+z^{-16}+z^{-24}+z^{-32}+z^{-48}$$

$$H_3(z)=1+z^{-14}+z^{-28}+z^{-42}+z^{-56} \qquad \text{(III)}$$

Figure 8:
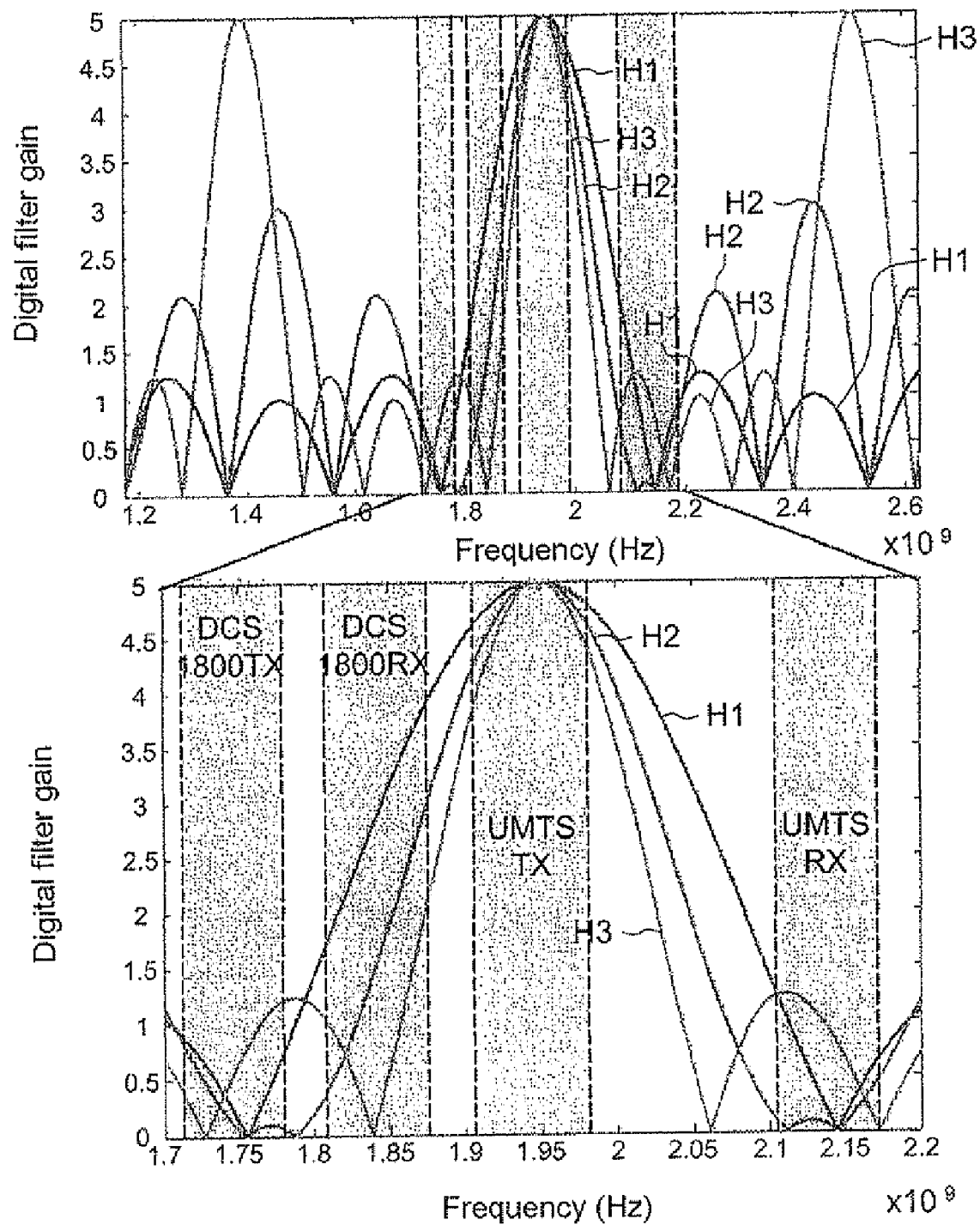
FIGS. 8 and 9 illustrate frequency responses of various digital filters produced within a device according to the invention.

The digital filters thus envisaged are respectively order 32, 48 and 56. Control of the multiplexing stage MUX will make it possible to be placed in one of the three hardware configurations corresponding to each of the three envisaged filters. The frequency responses of these filters are shown in FIG. 8.

Therefore, the transfer function $H_1$ makes it possible to place one transmission zero in the UMTS reception band and one in the DOS transmission band. The function $H_2$ makes it possible to place one transmission zero in each of the DCS transmission and reception bands and the function $H_3$ makes it possible to place two transmission zeros, one in the UMTS reception band and another in the DOS transmission band. The presence of two near zeros in the frequency response of this filter allows great attenuation in the near bands of the UMTS.

Figure 9:
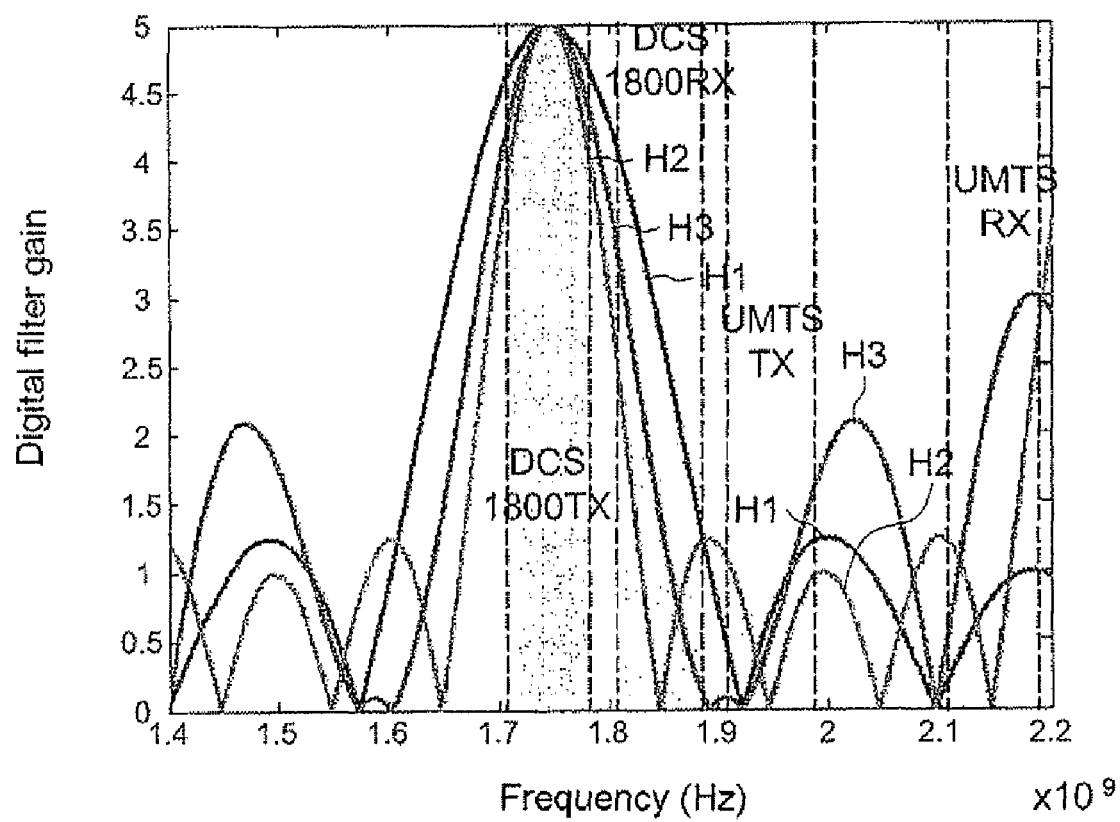

It is also possible to have even greater reconfigurability by changing the sampling frequency only. Specifically, in the case of the DOS 1800 standard, the frequency at which the data are rated is 6.99 GHz (4×1.7475 GHz). Keeping the same three sets of coefficients as above and changing the sampling frequency only gives the transfer functions of FIG. 9.

It should also be noted that the architecture that has just been described is not incompatible with the addition downstream of the device PA of at least one other amplification stage of conventional structure. Specifically, it may be possible depending on the envisaged application to amplify the signal up to a certain power level by using a device PA that has just been described and then further increasing this power level by using a conventional power amplification solution.

That which is claimed is:

1. An integrated circuit comprising:
   an input configured to receive a digital radio frequency (RF) signal;
   an output configured to deliver an analog RF signal; and
   a processing stage coupled between said input and said output and comprising a plurality of processing channels in parallel;
   each processing channel comprising a voltage switching block coupled to said input, and a transmission line at a frequency of the analog RF signal coupled in series between an output of the voltage switching block and said output.

2. An integrated circuit according to claim 1, wherein said transmission line comprises a quarter-wave transmission line.

3. An integrated circuit according to claim 1, wherein said plurality of processing channels are individually selectable.

4. An integrated circuit according to claim 1, wherein said processing stage further comprises a filtering stage coupled between said input and said voltage switching blocks.

5. An integrated circuit according to claim 4, wherein said plurality of processing channels are individually selectable; and wherein values of coefficients of said filtering stage depend on a number of selected processing channels.

6. An integrated circuit according to claim 4, wherein said filtering stage comprises a reconfigurable filtering stage.

7. An integrated circuit according to claim 4, wherein said filtering stage comprises a digital filtering stage.

8. An integrated circuit according to claim 7, wherein said digital filtering stage comprises a finite impulse response digital filtering stage.

9. An integrated circuit according to claim 4, wherein said filtering stage comprises digital delay circuitry coupled between said input and at least one of said voltage switching blocks.

10. An integrated circuit according to claim 9, wherein said digital filtering stage further comprises a controllable multiplexing stage coupled between said digital delay circuitry and said voltage switching blocks.

11. An integrated circuit according to claim 9, wherein said digital delay circuitry has adjustable delay values.

12. An integrated circuit according to claim 1, wherein at least one voltage switching block comprises a chain of inverters of increasing sizes.

13. An integrated circuit according to claim 1, wherein the integrated circuit is for use in an electronic device having a differential architecture.

14. An integrated circuit according claim 1, wherein said plurality of processing channels comprises a plurality of different sets of selectable transmission lines, each of the plurality of different sets of selectable transmission lines being of a quarter-wave type and of different frequencies.

15. An integrated circuit according claim 1, further comprising a delta-sigma modulator and a digital mixer coupled thereto to deliver the digital RF signal.

16. An integrated circuit comprising:
    an input configured to receive a digital radio frequency (RF) signal;
    an output configured to deliver an analog RF signal; and
    a processing stage coupled between said input and said output and comprising a plurality of individually selectable processing channels in parallel;
    each processing channel comprising a voltage switching block coupled to said input, and a quarter-wave transmission line at a frequency of the analog RF signal coupled in series between an output of the voltage switching block and said output.

17. An integrated circuit according to claim 16, wherein said processing stage further comprises a filtering stage coupled between said input circuitry and said voltage switching blocks.

18. An integrated circuit according to claim 17, wherein values of coefficients of said filtering stage depend on a number of selected processing channels.

19. A method of processing an initial digital radio frequency (RF) signal comprising:
    performing a digital to analog conversion with power amplification by performing a plurality of voltage switching processes in parallel on an intermediate digital RF signal based upon the initial RF signal; and
    delivering elementary analog signals and a summation of the elementary analog signals through respective transmission lines, so as to produce an analog RF signal having a power greater than that of the initial RF signal.

20. A method according to claim 19, wherein the plurality of transmission lines are of the quarter-wave type.

21. A method according to claim 19 further comprising filtering the initial RF signal to produce the intermediate signal.

22. A method according to claim 21, wherein an order of the filtering is adjusted by delaying samples of the initial RF signal upstream of the voltage switching processes.

23. A method according to claim 19 further comprising:
    performing a digital modulation process of the delta-sigma type on a base band digital RF signal to produce a modulated digital RF signal; and
    performing a digital frequency transposition on the modulated digital RF to produce the initial RF signal.

24. A method of making an integrated circuit comprising:
    coupling a processing stage between an input and an output and comprising a plurality of processing channels in parallel;

each processing channel comprising a voltage switching block coupled to the input, and a transmission line at a frequency of the analog RF signal coupled in series between an output of the voltage switching block and the output.

25. A method according to claim 24, wherein the plurality of processing channels are individually selectable.

26. A method according to claim 24, wherein the processing stage further comprises a filtering stage coupled between the input and the voltage switching blocks.

27. A method according to claim 26, wherein the plurality of processing channels are individually selectable; and wherein values of coefficients of the filtering stage depend on a number of selected processing channels.

28. A method according to claim 26, wherein the filtering stage comprises a reconfigurable filtering stage.

* * * * *